US012218180B2

(12) United States Patent
Lo et al.

(10) Patent No.: US 12,218,180 B2
(45) Date of Patent: Feb. 4, 2025

(54) MULTI-LAYERED RESISTOR WITH A TIGHT TEMPERATURE COEFFICIENT OF RESISTANCE TOLERANCE

(71) Applicant: Taiwan Semiconductor Manufacturing Company, Ltd., Hsinchu (TW)

(72) Inventors: Szu-Hsien Lo, Hsinchu County (TW); Che-Hung Liu, Hsinchu (TW); Tzu-Chung Tsai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/366,156

(22) Filed: Aug. 7, 2023

(65) Prior Publication Data

US 2023/0387184 A1    Nov. 30, 2023

Related U.S. Application Data

(62) Division of application No. 17/459,093, filed on Aug. 27, 2021, now Pat. No. 11,923,403.

(51) Int. Cl.
*H01L 23/52* (2006.01)
*H01L 23/522* (2006.01)
*H01L 27/01* (2006.01)
*H01L 27/13* (2006.01)
*H01L 49/02* (2006.01)

(52) U.S. Cl.
CPC .......... *H01L 28/24* (2013.01); *H01L 23/5228* (2013.01)

(58) Field of Classification Search
CPC ............ H01L 23/5228; H01L 23/5226; H01L 27/016; H01L 27/13; H01L 28/20; H01L 28/24

See application file for complete search history.

(56) References Cited

U.S. PATENT DOCUMENTS

| 2008/0153245 A1* | 6/2008 | Lin ..................... H01L 27/0794 |
| | | 257/E21.003 |
| 2011/0291225 A1* | 12/2011 | Klatt ....................... H01L 28/60 |
| | | 257/506 |
| 2014/0184381 A1* | 7/2014 | Hao ........................ H01L 28/24 |
| | | 29/25.42 |

(Continued)

OTHER PUBLICATIONS

Myers et al. "The B to A Phase Transition of Tantalum Coatings Deposited by Modulated Pulsed Power Magnetron Sputtering." Surface & Coatings Technology 214 (2013) 38-45, published on Nov. 2, 2012.

(Continued)

*Primary Examiner* — Omar F Mojaddedi
(74) *Attorney, Agent, or Firm* — Eschweiler & Potashnik, LLC

(57) ABSTRACT

Various embodiments of the present disclosure are directed towards an integrated chip (IC). The IC comprises a substrate. A resistor overlies the substrate. The resistor comprises a first metal nitride structure, a second metal nitride structure spaced from the first metal nitride structure, and a metal structure disposed between the first metal nitride structure and the second metal nitride structure. A first dielectric structure is disposed over the substrate and the resistor.

20 Claims, 8 Drawing Sheets

(56) References Cited

U.S. PATENT DOCUMENTS

| | | | |
|---|---|---|---|
| 2015/0108607 A1* | 4/2015 | Chen .................. | H01L 23/5228 |
| | | | 257/533 |
| 2019/0295947 A1* | 9/2019 | Kim .................... | H01L 23/5226 |
| 2020/0235087 A1* | 7/2020 | Ding ................... | H01L 23/5223 |
| 2022/0310513 A1* | 9/2022 | Bak .................... | H01L 23/5228 |

OTHER PUBLICATIONS

Non-Final Office Action dated Jul. 20, 2023 for U.S. Appl. No. 17/459,093.

Notice of Allowance dated Nov. 3, 2023, for U.S. Appl. No. 17/459,093.

* cited by examiner

MULTI-LAYERED RESISTOR WITH A TIGHT TEMPERATURE COEFFICIENT OF RESISTANCE TOLERANCE

REFERENCE TO RELATED APPLICATION

This application is a Divisional of U.S. application Ser. No. 17/459,093, filed on Aug. 27, 2021, the contents of which are hereby incorporated by reference in their entirety.

BACKGROUND

Modern integrated chips use a wide range of devices to achieve varying functionalities. In general, integrated chips comprise active devices and passive devices. Active devices include transistors (e.g., metal-oxide-semiconductor field-effect transistor (MOSFETs)), while passive devices include inductors, capacitors, and resistors. Resistors are widely used in many applications such as resistor-capacitor (RC) circuits, power drivers, power amplifiers, radio frequency (RF) applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
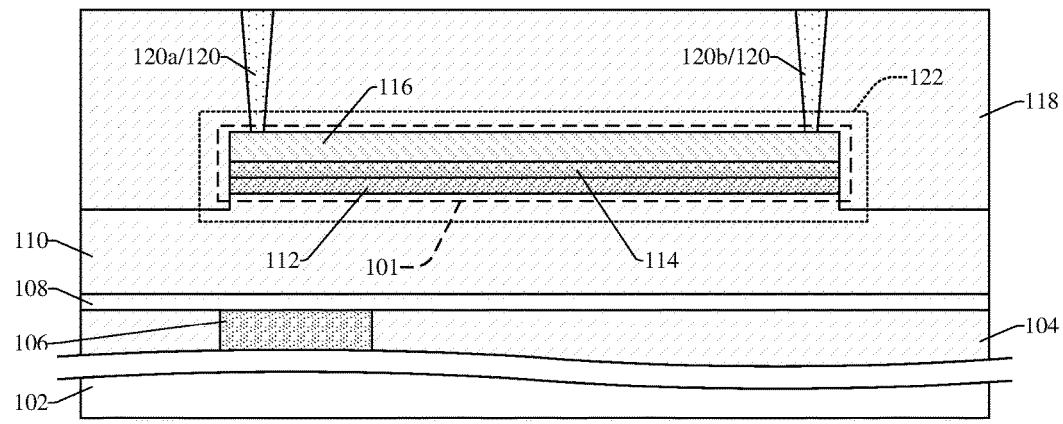
FIG. 1 illustrates a cross-sectional view of some embodiments of an integrated chip (IC) comprising a resistor that has a tight temperature coefficient of resistance (TCR) tolerance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) have passive devices disposed over/within a substrate. The passive devices may, for example, include inductors, resistors, capacitors, diodes, etc. One type of resistor used in an IC is a thin film resistor (TFR). The TFR comprises a resistive structure that extends between two conductors. Typically, the resistive structure comprises less than or equal to two resistive layers. For example, the resistive structure of some TFRs comprises a single resistive material layer (e.g., polysilicon, silicon chromium (SiCr), etc.), whereas the resistive structure of some other TFRs comprises two resistive material layers.

TFRs with single-layered resistive structures (e.g., single resistive layer) and TFRs with dual-layered resistive structures (e.g., two resistive material layers) may not be suitable for all applications. For example, a TFR with a temperature coefficient of resistance (TCR) tolerance (e.g., ±20 parts per million per degrees Celsius (ppm/° C.) from zero (0) ppm/° C.) that is as tight as possible (e.g., the least amount of variation from zero (0) ppm/° C. as possible) is desirable for some applications (e.g., high-voltage applications, high-precision measuring instruments (e.g., multimeter), laser diode current drivers, etc.). The TCR tolerance is the permissible limits of variation in the TCR of a TFR (e.g., ±20 ppm/° C. from zero (0) ppm/° C. at a given temperature). More specifically, some applications desire a TCR tolerance from zero (0) ppm/° C. that is tighter than ±20 ppm/° C. The TFRs with the single-layered resistive structures and the TFRs with dual-layered resistive structures may have TCR tolerances that are too high for such applications (e.g., greater than about 20 ppm/° C. at zero (0) ppm/° C.). As such, a TFR with a tighter TCR tolerance is desirable (e.g., a variation that is smaller than or equal to about 10 ppm/° C. from zero (0) ppm/° C.).

Various embodiments of the present application are directed toward an IC. The IC comprises a resistor (e.g., TFR) overlying a substrate. The resistor has a multi-layered resistive structure. The multi-layered resistive structure comprises a first metal nitride structure, a second metal nitride structure overlying the first metal nitride structure, and a metal structure disposed between the first metal nitride structure and the second metal nitride structure. Because the resistor comprises the first metal nitride structure, the metal structure, and the second metal nitride structure, a TCR tolerance of the resistor is tight (e.g., a variation that is smaller than or equal to about ±10 ppm/° C. from zero (0) ppm/° C.). As such, the resistor may be more suitable for some applications than typical TFRs (e.g., TFRs with single-layered or dual-layered resistive structure).

FIG. 1 illustrates a cross-sectional view 100 of some embodiments of an integrated chip (IC) comprising a resistor 101 that has a tight temperature coefficient of resistance (TCR) tolerance.

As shown in the cross-sectional view 100 of FIG. 1, a first inter-metal dielectric (IMD) structure 104 overlies a substrate 102. A plurality of conductive wires 106 (e.g., metal wires) are disposed within the first IMD structure 104 and overlie the substrate 102. In some embodiments, a first etch stop layer 108 is disposed over the first IMD structure 104 and the conductive wires 106. A second IMD structure 110 is disposed over the first IMD structure 104 and the conductive wires 106 (and the first etch stop layer 108).

A resistor 101 (e.g., a thin film resistor (TFR)) is disposed over the second IMD structure 110. A third IMD structure 118 is disposed over the second IMD structure 110 and the resistor 101. A first plurality of conductive vias 120 (e.g., metal vias) are disposed in the third IMD structure 118 and over the resistor 101. The first plurality of conductive vias 120 extend vertically through the third IMD structure 118.

One or more of the first plurality of conductive vias 120 are electrically coupled to the resistor 101. For example, a first conductive via 120a and a second conductive via 120b are electrically coupled to the resistor 101. The first conductive via 120a is spaced (e.g., laterally spaced) from the second conductive via 120b. The first conductive via 120a contacts the resistor 101 at a different location that the second conductive via 120b (e.g., near opposite ends of the resistor 101). The resistor 101 is configured to resist (e.g., reduce) current flow between the first conductive via 120a and the second conductive via 120b.

The resistor 101 comprise a first metal nitride structure 112, a metal structure 114, and a second metal nitride structure 116. The first metal nitride structure 112 is disposed over the second IMD structure 110. The second metal nitride structure 116 is spaced (e.g., vertically spaced) from the first metal nitride structure 112. The metal structure 114 is disposed between (e.g., vertically between) the first metal nitride structure 112 and the second metal nitride structure 116. In some embodiments, because the resistor 101 comprises the first metal nitride structure 112, the metal structure 114, and the second metal nitride structure 116, the resistor may be referred to as a multi-layered resistor (e.g., a tri-layered TFR). In further embodiments, the resistor 101 may, for example, be used in resistor-capacitor (RC) circuits, power drivers, power amplifiers, radio frequency (RF) applications, analog to digital converters (ADCs), digital to analog converters (DACs), or the like.

Because the resistor 101 comprises the first metal nitride structure 112, the metal structure 114, and the second metal nitride structure 116, the resistor 101 may have a tight temperature coefficient of resistance (TCR) tolerance. For example, in some embodiments, the resistor 101 may have a TCR tolerance that is tighter than or equal to about ±10 ppm/° C. from zero (0) ppm/° C. As such, the resistor 101 (and/or the IC comprising the resistor 101) may be more suitable for some applications (e.g., high-voltage applications, high-precision measuring instruments, laser diode current drivers, etc.) than typical TFRs (e.g., TFRs with single-layered or dual-layered resistive structure).

Figure 2:
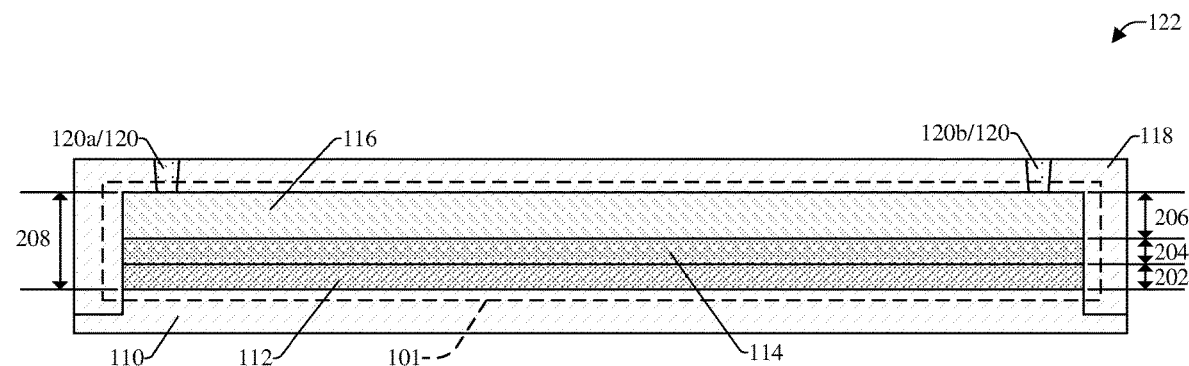
FIG. 2 illustrates a magnified cross-sectional view of some embodiments of an area of the IC of FIG. 1.

FIG. 2 illustrates a magnified cross-sectional view 200 of some embodiments of an area 122 of the IC of FIG. 1.

As shown in the cross-sectional view 200 of FIG. 2, the metal structure 114 is disposed vertically between the first metal nitride structure 112 and the second metal nitride structure 116. In some embodiments, the metal structure 114 contacts (e.g., directly contacts) both the first metal nitride structure 112 and the second metal nitride structure 116. In further embodiments, the second IMD structure 110 has a first upper surface and a second upper surface. The first upper surface of the second IMD structure 110 is disposed over the second upper surface of the second IMD structure 110. In yet further embodiments, the resistor 101 is disposed over (e.g., directly over) the first upper surface of the second IMD structure 110, as shown in the cross-sectional view 200 of FIG. 2.

In some embodiments, the resistor 101 has a sheet resistance of less than or equal to about 20 ohms/square. In other words, the first metal nitride structure 112, the metal structure 114, and the second metal nitride structure 116 collectively have a sheet resistance of less than or equal to about 20 ohms/square. In some embodiments, the resistor 101 has resistivity between about 12000 ohm-angstrom (Ω·Å) and about 24000 ohm-angstrom (Ω·Å). In further embodiments, the resistor 101 has resistivity of about 16300 ohm-angstrom (Ω·Å). In yet further embodiments, the TCR of the resistor 101 may be closer to zero (0) ppm/° C. the closer the resistivity of the resistor 101 is to 16300 ohm-angstrom (Ω·Å) (e.g., the TCR of the resistor 101 is correlated to the resistivity of the resistor 101).

The first metal nitride structure 112 has a first thickness 202. The metal structure 114 has a second thickness 204. The second metal nitride structure 116 has a third thickness 206. The third thickness 206 is greater than the first thickness 202. In some embodiments, if the third thickness 206 is less than the first thickness 202, the resistor 101 may have a higher TCR tolerance and/or a cost to manufacture the resistor 101 may be increased without any appreciable improvement in performance. In some embodiments, the second thickness 204 is greater than the first thickness 202 and less than the third thickness 206. In other embodiments, the second thickness 204 is equal to the first thickness 202 and less than the third thickness 206. In yet other embodiments, the second thickness 204 is less than the first thickness 202 and less than the third thickness 206.

The resistor 101 has a total thickness 208 that corresponds to a distance between a lower surface (e.g., lowermost surface) of the first metal nitride structure 112 and an upper surface (e.g., uppermost surface) of the second metal nitride structure 116. In some embodiments, the second thickness 204 is between about 5 percent and about 20 percent of the total thickness 208 (e.g., the second thickness 204 divided by the total thickness 208). In some embodiments, if the second thickness 204 is less than about 5 percent or greater than about 20 percent of the total thickness 208, the resistor 101 may have a higher TCR tolerance and/or the cost to manufacture the resistor 101 may be increased without any appreciable improvement in performance. In further embodiments, the second thickness 204 is 10.3 percent of the total thickness 208. The first thickness 202 may be between about 1 percent and about 47 percent of the total thickness 208 (e.g., the first thickness 202 divided by the total thickness 208). The third thickness 206 may be between about 41 percent and about 94 percent of the total thickness 208 (e.g., the third thickness 206 divided by the total thickness 208).

In some embodiments, the total thickness 208 is less than about 3000 angstroms (Å). In further embodiments, the total thickness 208 is less than about 1500 Å. In yet further embodiments, the total thickness 208 is about 1450 Å. The first thickness 202 may be less than about 200 Å. In some embodiments, the first thickness 202 may be less than about 100 Å. In further embodiments, the first thickness 202 may be about 70 Å. The second thickness 204 may be less than about 350 Å. In some embodiments, the second thickness 204 may be less than about 175 Å. In further embodiments, the second thickness 204 may be about 150 Å. The third thickness 206 may be less than about 2600 Å. In some embodiments, the third thickness 206 may be less than about 1300 Å. In further embodiments, the third thickness 206 may be about 1230 Å.

The first metal nitride structure 112 is or comprises a first metal nitride material. The first metal nitride material may be, for example, tantalum nitride (TaN), titanium nitride (TiN), cobalt nitride (CoN), some other metal nitride (e.g., some other transition metal nitride), or the like. The second metal nitride structure 116 is or comprises a second metal nitride material. The second metal nitride material may be, for example, tantalum nitride (TaN), titanium nitride (TiN), cobalt nitride (CoN), some other metal nitride (e.g., some other transition metal nitride), or the like. The metal structure 114 is or comprises a metal material. The metal material may be, for example, tantalum (Ta), titanium (Ti), cobalt (Co), or some other metal material (e.g., some other transition metal), or the like.

In some embodiments, the first metal nitride structure 112 and the second metal nitride structure 116 are or comprise a same metal nitride material. For example, the first metal nitride structure 112 and the second metal nitride structure 116 are both tantalum nitride (TaN). In further embodiments, the first metal nitride structure 112, the metal structure 114, and the second metal nitride structure 116 comprise a same metal material. For example, the metal structure 114 is titanium (Ti), and the first metal nitride structure 112 and the second metal nitride structure 116 are both titanium nitride (TiN). In such embodiments, the first metal nitride structure 112, the metal structure 114, and the second metal nitride structure 116 comprise a same metal material (titanium (Ti)). It will be appreciated that the other metal materials may be substituted as the same metal material (e.g., tantalum (Ta), cobalt (Co), etc.). It will also be appreciated that general references to specific metal nitrides (e.g., TaN) include any possible stoichiometric values of their corresponding metal nitride. For example, the reference to tantalum nitride (TaN) is a general reference to tantalum nitride ($Ta_xN_y$), where x and y are some combination of numbers (e.g., $Ta_2N$, $Ta_6N_{2.5}$, etc.).

The first metal nitride structure 112 may comprise between about 5 percent nitrogen (N) by atomic percent and about 50 percent nitrogen (N) by atomic percent. In some embodiments, if the first metal nitride structure 112 comprises less than about 5 percent nitrogen (N) by atomic percent or greater than about 50 percent nitrogen (N) by atomic percent, the resistor 101 may have a higher TCR tolerance and/or the cost to manufacture the resistor 101 may be increased without any appreciable improvement in performance. In further embodiments, the first metal nitride structure 112 comprises about 32 percent nitrogen (N) by atomic percent.

The second metal nitride structure 116 may comprise between about 5 percent nitrogen (N) by atomic percent and about 50 percent nitrogen (N) by atomic percent. In some embodiments, if the second metal nitride structure 116 comprises less than about 5 percent nitrogen (N) by atomic percent or greater than about 50 percent nitrogen (N) by atomic percent, the resistor 101 may have a higher TCR tolerance and/or the cost to manufacture the resistor 101 may be increased without any appreciable improvement in performance. In further embodiments, the second metal nitride structure 116 comprises about 32 percent nitrogen (N) by atomic percent.

In some embodiments, the first metal nitride structure 112 is tantalum nitride (TaN), the metal structure 114 is tantalum (Ta), and the second metal nitride structure 116 is tantalum nitride (TaN). In some embodiments, the resistor 101 may be referred to as a TaN/Ta/TaN resistor when the first metal nitride structure 112 is tantalum nitride (TaN), the metal structure 114 is tantalum (Ta), and the second metal nitride structure 116 is tantalum nitride (TaN).

For example, the first metal nitride structure 112 of the TaN/Ta/TaN resistor may comprise between about 5 percent nitrogen (N) by atomic percent and about 50 percent nitrogen (N) by atomic percent. In some embodiments, if the first metal nitride structure 112 of the TaN/Ta/TaN resistor comprises less than about 5 percent nitrogen (N) by atomic percent or greater than about 50 percent nitrogen (N) by atomic percent, the TaN/Ta/TaN resistor may have a higher TCR tolerance and/or the cost to manufacture the TaN/Ta/TaN resistor may be increased without any appreciable improvement in performance. In further embodiments, the first metal nitride structure 112 of the TaN/Ta/TaN resistor comprises about 32 percent nitrogen (N) by atomic percent. In yet further embodiments, the first metal nitride structure 112 of the TaN/Ta/TaN resistor is $Ta_2N$.

The second metal nitride structure 116 of the TaN/Ta/TaN resistor may comprise between about 5 percent nitrogen (N) by atomic percent and about 50 percent nitrogen (N) by atomic percent. In some embodiments, if the second metal nitride structure 116 of the TaN/Ta/TaN resistor comprises less than about 5 percent nitrogen (N) by atomic percent or greater than about 50 percent nitrogen (N) by atomic percent, the TaN/Ta/TaN resistor may have a higher TCR tolerance and/or the cost to manufacture the TaN/Ta/TaN resistor may be increased without any appreciable improvement in performance. In further embodiments, the second metal nitride structure 116 of the TaN/Ta/TaN resistor comprises about 32 percent nitrogen (N) by atomic percent. In yet further embodiments, the second metal nitride structure 116 of the TaN/Ta/TaN resistor is $Ta_2N$.

In some embodiments, the first metal nitride structure 112 is an amorphous solid, however, it will be appreciated that, in other embodiments, the first metal nitride structure 112 may be a crystalline solid. In further embodiments, the second metal nitride structure 116 is a crystalline solid, however, it will be appreciated that, in other embodiments, the second metal nitride structure 116 may be an amorphous solid. In some embodiments, the first metal nitride structure 112 is an amorphous solid and the second metal nitride structure 116 is a crystalline solid with a hexagonal crystalline phase (e.g., hexagonal crystal structure). In other embodiments, both the first metal nitride structure 112 and the second metal nitride structure 116 are amorphous solids or crystalline solids.

The metal structure 114 is a crystalline solid. In some embodiments, the crystalline phase (e.g., crystal structure) of the metal structure 114 is at least 50 percent alpha-phase (α-phase TaN). In further embodiments, if the crystalline phase of the metal structure 114 is less than 50 percent alpha-phase, the resistor 101 may have a higher TCR tolerance and/or the cost to manufacture the resistor 101 may be increased without any appreciable improvement in performance. It will be appreciated, however, that other percentages are amendable. In some embodiments, the crystalline phases may be determined by a quantitative phase analysis (QPA) utilizing X-ray diffraction (XRD).

For example, the crystalline phase of the metal structure 114 of the TaN/Ta/TaN resistor is at least 50 percent alpha-phase tantalum nitride (α-phase TaN). Alpha-phase tantalum nitride (α-phase TaN), which is body-centered-cubic, is different than beta-phase tantalum nitride (β-phase TaN), which is metastable-tetragonal. In some embodiments, alpha-phase tantalum nitride (α-phase TaN) has a resistivity of about 3000 ohm-angstrom (Ω·Å) and beta-phase tantalum nitride (β-phase TaN) has a resistivity of about 18900 ohm-angstrom (Ω·Å). In further embodiments, if the crystalline phase of the metal structure 114 of the TaN/Ta/TaN resistor is less than 50 percent alpha-phase tantalum nitride (α-phase TaN), the TaN/Ta/TaN resistor may have a higher TCR tolerance and/or the cost to manufacture the TaN/Ta/TaN resistor may be increased without any appreciable improvement in performance. In yet further embodiments, the first metal nitride structure 112 of the TaN/Ta/TaN resistor is an amorphous solid, the metal structure 114 of the TaN/Ta/TaN resistor is a crystalline solid with a crystalline phase that is at least 50 percent alpha-phase tantalum nitride (α-phase TaN), and the second metal nitride structure 116 of the TaN/Ta/TaN resistor is a crystalline solid with a hexagonal crystalline phase.

Also shown in the cross-sectional view 200 of FIG. 2, in some embodiments, outer sidewalls of the metal structure 114 are substantially aligned with outer sidewalls of the first metal nitride structure 112, respectively. In further embodiments, outer sidewalls of the second metal nitride structure 116 are substantially aligned with the outer sidewalls of the metal structure 114, respectively. In yet further embodiments, the outer sidewalls of the first metal nitride structure 112 are substantially aligned with outer sidewalls of the second IMD structure 110.

Figure 3:
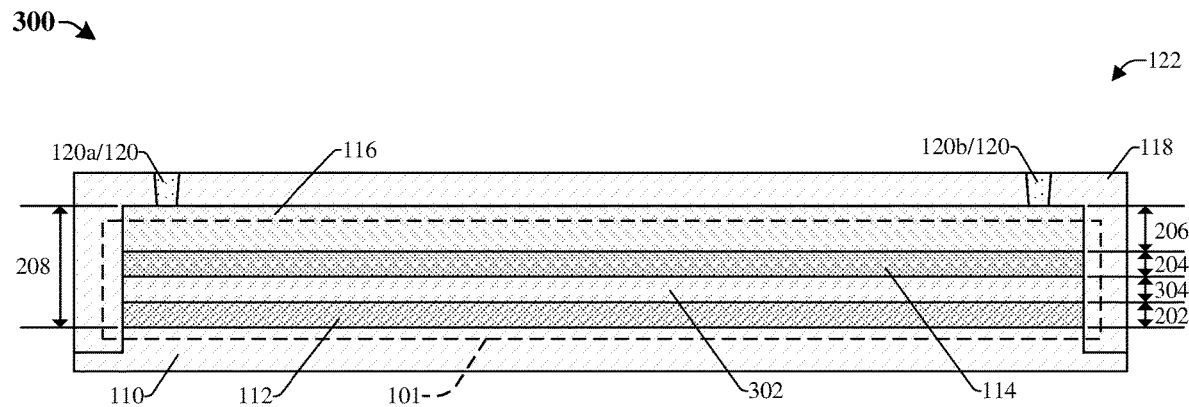
FIG. 3 illustrates a magnified cross-sectional view of some other embodiments of the area of the IC of FIG. 1.

FIG. 3 illustrates a magnified cross-sectional view 300 of some other embodiments of the area 122 of the IC of FIG. 1.

As shown in the cross-sectional view 300 of FIG. 3, the resistor 101 comprises a third metal nitride structure 302. The third metal nitride structure 302 is disposed between (e.g., vertically between) the first metal nitride structure 112 and the metal structure 114. The third metal nitride structure 302 is or comprises a third metal nitride material. The third metal nitride material may be, for example, tantalum nitride (TaN), titanium nitride (TiN), cobalt nitride (CoN), some other metal nitride (e.g., some other transition metal nitride), or the like. In some embodiments, the first metal nitride structure 112 and the third metal nitride structure 302 are or comprise a same metal nitride material. For example, the first metal nitride structure 112 and the third metal nitride structure 302 are both tantalum nitride (TaN). In further embodiments, the first metal nitride structure 112, the metal structure 114, the second metal nitride structure 116, and the third metal nitride structure 302 comprise a same metal material. For example, the metal structure 114 is titanium (Ti), the first metal nitride structure 112 is titanium nitride (TiN), the second metal nitride structure 116 is titanium nitride (TiN), and the third metal nitride structure 302 is titanium nitride (TiN).

The third metal nitride structure 302 has a fourth thickness 304. In some embodiments, the fourth thickness 304 is less than or equal to the first thickness 202. In other embodiments, the fourth thickness 304 is greater than the first thickness 202. In further embodiments, the fourth thickness 304 is between about 2 Å and about 100 Å. In some embodiments, the third metal nitride structure 302 is an amorphous solid, however, it will be appreciated that, in other embodiments, the third metal nitride structure 302 may be a crystalline solid. In further embodiments, the metal material (e.g., Ta) of the third metal nitride structure 302 may have a different crystalline phase than the metal structure 114 (e.g., the tantalum (Ta) of the third metal nitride structure 302 may be substantially beta-phase tantalum nitride (β-phase TaN)).

The third metal nitride structure 302 may comprise between about 10 percent nitrogen (N) by atomic percent and about 50 percent nitrogen (N) by atomic percent. In some embodiments, if the third metal nitride structure 302 of comprises less than about 10 percent nitrogen (N) by atomic percent or greater than about 50 percent nitrogen (N) by atomic percent, the resistor 101 may have a higher TCR tolerance and/or the cost to manufacture the resistor 101 may be increased without any appreciable improvement in performance. In further embodiments, the third metal nitride structure 302 comprises about 32 percent nitrogen (N) by atomic percent. In some embodiments, the third metal nitride structure 302 may comprise a same percent of nitrogen by atomic percentage as the first metal nitride structure 112 (and/or the second metal nitride structure 116). In other embodiments, the third metal nitride structure 302 may comprise a different (e.g., greater) percent of nitrogen by atomic percentage as the first metal nitride structure 112 (and/or the second metal nitride structure 116).

For example, the third metal nitride structure 302 of a TaN/Ta/TaN resistor comprises between about 10 percent nitrogen (N) by atomic percent and about 50 percent nitrogen (N) by atomic percent. In some embodiments, if the third metal nitride structure 302 of the TaN/Ta/TaN resistor comprises less than about 10 percent nitrogen (N) by atomic percent or greater than about 50 percent nitrogen (N) by atomic percent, the metal structure 114 may not be formed with a crystalline phase that is at least 50 percent alpha-phase tantalum nitride (α-phase TaN), which may cause the TaN/Ta/TaN resistor to have a higher TCR tolerance. In further embodiments, the third metal nitride structure 302 of the TaN/Ta/TaN resistor comprises about 32 percent nitrogen (N) by atomic percent, which may be the same percentage of nitrogen by atomic percent as the first metal nitride structure 112 (and/or the second metal nitride structure 116) of the TaN/Ta/TaN resistor. In yet further embodiments, the third metal nitride structure 302 of the TaN/Ta/TaN resistor is Ta$_2$N.

Also shown in the cross-sectional view 300 of FIG. 3, in some embodiments, outer sidewalls of the third metal nitride structure 302 are substantially aligned with the outer sidewalls of the first metal nitride structure 112, respectively. In further embodiments, the outer sidewalls of the metal structure 114 are substantially aligned with the outer sidewalls of the third metal nitride structure 302, respectively.

Figure 4:
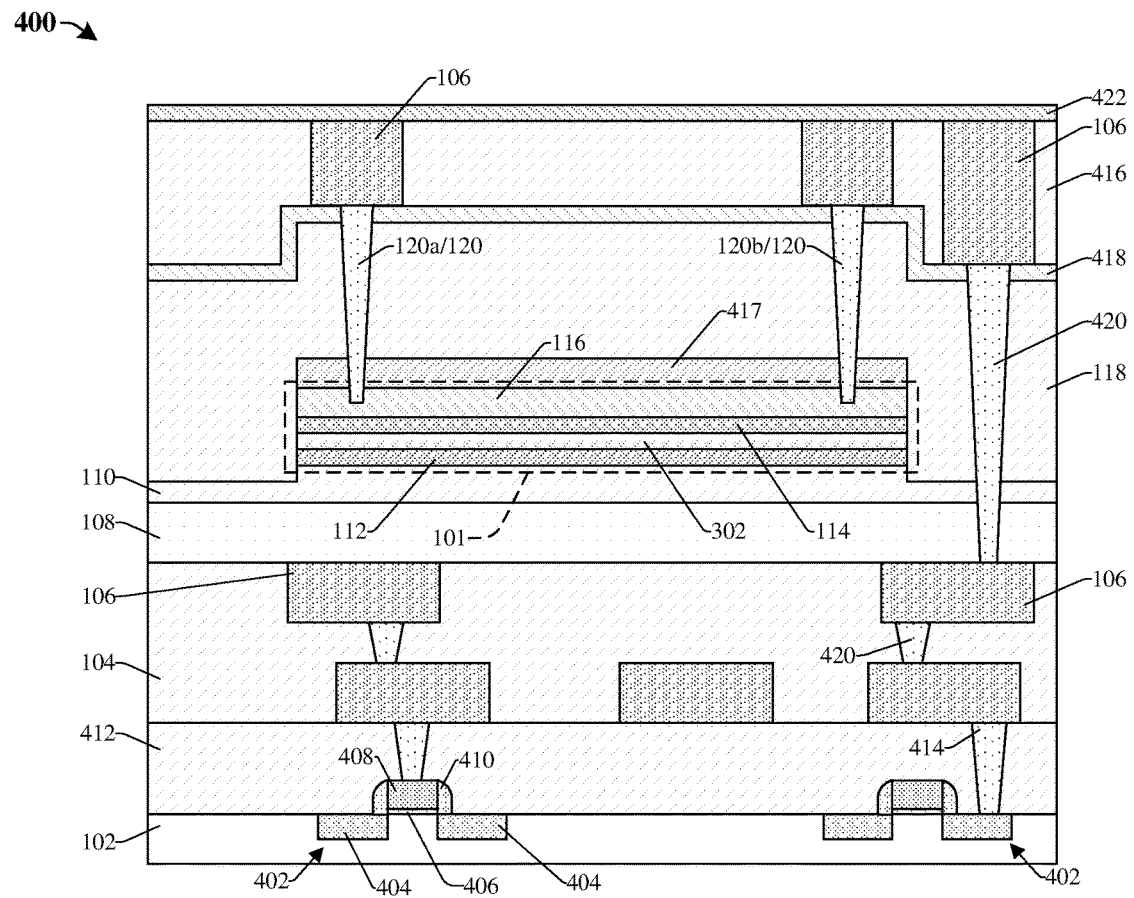
FIG. 4 illustrates a cross-sectional view of some more detailed embodiments of the IC of FIG. 1.

FIG. 4 illustrates a cross-sectional view 400 of some more detailed embodiments of the IC of FIG. 1. While the cross-sectional view 400 of FIG. 4 illustrates the resistor 101 having the first metal nitride structure 112, the second metal nitride structure 116, the third metal nitride structure 302, and the metal structure 114, it will be appreciated the resistor 101 may instead have the first metal nitride structure 112, the second metal nitride structure 116, and the metal structure 114 (or some other multi-layered resistor).

As shown in the cross-sectional view 400 of FIG. 4, one or more semiconductor devices 402 (e.g., insulated gate field-effect transistors (IGFETs)) are disposed within/over the substrate 102. The substrate 102 comprises any type of semiconductor body (e.g., monocrystalline silicon/CMOS bulk, germanium (Ge), silicon-germanium (SiGe), gallium arsenide (GaAs), silicon on insulator (SOI), etc.). In some embodiments, the semiconductor devices 402 each comprise source/drain regions 404, a gate dielectric layer 406, a gate electrode 408, and a sidewall spacer 410. The gate dielectric layer 406 overlies the substrate 102, and the gate electrode 408 overlies the gate dielectric layer 406. In some embodiments, the gate electrode 408 comprises polysilicon. In such embodiments, the gate dielectric layer 406 may comprise or be, for example, an oxide (e.g., silicon dioxide ($SiO_2$)) In other embodiments, the gate electrode 408 may be or comprise a metal, such as aluminum (Al), copper (Cu), titanium (Ti), tantalum (Ta), tungsten (W), molybdenum (Mo), cobalt (Co), or the like. In such embodiments, the gate dielectric layer 406 may be or comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

The source/drain regions 404 are disposed in the substrate 102 and on opposite sides of the gate electrode 408. The source/drain regions 404 are doped regions (e.g., n-type or p-type) of the substrate 102. The sidewall spacer 410 overlies the substrate and laterally surrounds the gate electrode 408. The sidewall spacer 410 may be or comprise, for example, a nitride (e.g., silicon nitride (SiN)), an oxy-nitride (e.g., silicon oxy-nitride (SiON)), an oxide (e.g., $SiO_2$), some other dielectric material, or a combination of the foregoing.

An interlayer dielectric (ILD) structure 412 is disposed over the substrate 102 and the semiconductor devices 402. The ILD structure 412 comprises one or more stacked ILD layers, which may respectively comprise a low-k dielectric (e.g., a dielectric material with a dielectric constant less than about 3.9), an oxide (e.g., $SiO_2$), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. A plurality of conductive contacts 414 are disposed over the substrate 102 and embedded in the ILD structure 412. The plurality of conductive contacts 414 may be or comprise, for example, tungsten (W), copper (Cu), aluminum (Al), some other conductive material, or a combination of the foregoing. The plurality of conductive contacts 414 extend vertically through the ILD structure 412 and are electrically coupled to the semiconductor devices 402 and/or the substrate 102.

The first IMD structure 104 is disposed over the ILD structure 412. The second IMD structure 110 is disposed over the first IMD structure 104. The third IMD structure 118 is disposed over the second IMD structure 110. A fourth IMD structure 416 is disposed over the third IMD structure 118. The first IMD structure 104, the second IMD structure 110, the third IMD structure 118, and the fourth IMD structure 416 each comprise one or more stacked IMD layers, which may respectively comprise a low-k dielectric (e.g., a dielectric material with a dielectric constant less than about 3.9), an oxide (e.g., $SiO_2$), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. In some embodiments, the second IMD structure 110 has thickness of about 200 Å, however, it will be appreciated that the second IMD structure 110 may have some other thickness. In further embodiments, the third IMD structure 118 has thickness of about 5600 Å, however, it will be appreciated that third IMD structure 118 may have some other thickness. In yet further embodiments, the fourth IMD structure 416 has thickness of about 12000 Å, however, it will be appreciated that fourth IMD structure 416 may have some other thickness.

In some embodiments, the first etch stop layer 108 is disposed between the first IMD structure 104 and the second IMD structure 110. In other embodiments, the first etch stop layer 108 is omitted. The first etch stop layer 108 may be or comprise, for example, a carbide (e.g., silicon carbide (SiC)), a nitride (e.g., SiN), an oxy-nitride (e.g., SiON), or the like. In some embodiments, the first etch stop layer 108 has thickness of about 550 Å, however, it will be appreciated that the first etch stop layer 108 may have some other thickness.

Also shown in the cross-sectional view 400 of FIG. 4, a capping structure 417 is disposed over the resistor 101. The capping structure 417 covers an upper surface of the resistor 101. The capping structure 417 is disposed between (e.g., vertically between) the second metal nitride structure 116 and the third IMD structure 118. In some embodiments, the capping structure 417 contacts (e.g., directly contacts) the second metal nitride structure 116. In further embodiments, the second metal nitride structure 116 separates (e.g., vertically separates) the capping structure 417 from the metal structure 114. In yet further embodiments, outer sidewalls of the capping structure 417 are substantially aligned with outer sidewalls of the second metal nitride structure 116, respectively.

The capping structure 417 may be or comprise, for example, a nitride (e.g., SiN), an oxy-nitride (e.g., SiON), some other dielectric material, or a combination of the foregoing. In some embodiments, the capping structure 417 has a thickness between about 500 Å and about 1000 Å. In further embodiments, the thickness of the capping structure 417 may be about 750 Å, however, it will be appreciated that the capping structure 417 may have some other thickness. In yet further embodiments, the capping structure 417 is a nitride that has a different chemical composition than the second metal nitride structure 116 (e.g., the capping structure 417 is SiN and the second metal nitride structure 116 is TaN).

The resistor 101 and the capping structure 417 are disposed over the semiconductor devices 402 and the substrate 102. In some embodiments, the resistor 101 and the capping structure 417 are disposed over the first etch stop layer 108. The third IMD structure 118 is disposed over and covering both the resistor 101 and the capping structure 417.

In some embodiments, a second etch stop layer 418 is disposed between (e.g., vertically between) the third IMD structure 118 and the fourth IMD structure 416. In other embodiments, the second etch stop layer 418 is omitted. The second etch stop layer 418 may be or comprise, for example, a nitride (e.g., SiN), a carbide (e.g., SiC), an oxy-nitride (e.g., SiON), or the like. In some embodiments, the second etch stop layer 418 has thickness of about 5000 Å, however, it will be appreciated that the second etch stop layer 418 may have some other thickness. In further embodiments, the second etch stop layer 418 may be or comprise a different material than the first etch stop layer 108 (e.g., the second etch stop layer 418 is SiN and the first etch stop layer 108 is SiC).

The plurality of conductive wires 106 are disposed in one or more of the IMD structures. For example, one or more of the plurality of conductive wires 106 are disposed in the first IMD structure 104 and the fourth IMD structure 416, as shown in the cross-sectional view 400 of FIG. 4. While not shown in the cross-sectional view 400 of FIG. 4, it will be appreciated that one or more of the plurality of conductive wires 106 may be disposed in the second IMD structure 110 and/or the third IMD structure 118. The plurality of conductive wires 106 may be or comprise, for example, copper (Cu), aluminum (Al), gold (Au), silver (Ag), some other conductive material, or a combination of the foregoing.

A second plurality of conductive vias 420 are disposed in one or more of the IMD structures. For example, one or more of the second plurality of conductive vias 420 are disposed in the first IMD structure 104, the second IMD structure 110, and the third IMD structure 118. In some embodiments, one or more of the second plurality of conductive vias 420 may also be disposed in the first etch stop layer 108 and/or the second etch stop layer 418. In further embodiments, one or more of the second plurality of conductive vias 420 extend vertically through two or more of the IMD structures. For example, one or more of the second plurality of conductive vias 420 may extend vertically through the first etch stop layer 108, the second IMD structure 110, the second etch stop layer 418, and the third IMD structure 118. The first plurality of conductive vias 120 and the second plurality of conductive vias 420 may be or comprise, for example, copper (Cu), tungsten (W), aluminum (Al), gold (Au), silver (Ag), some other conductive material, or a combination of the foregoing.

Also shown in the cross-sectional view 400 of FIG. 4, the first plurality of conductive vias 120 extend vertically through the third IMD structure 118 and the capping structure 417, such that the first plurality of conductive vias 120 are electrically coupled to the resistor 101. In some embodiments, the first plurality of conductive vias 120 extend partially through the second metal nitride structure 116, such that lower surfaces of the first plurality of conductive vias 120 contact the second metal nitride structure 116. For example, the first conductive via 120*a* (and the second conductive via 120*b*) extends partially through the second metal nitride structure 116, such that a lower surface of the first conductive via 120*a* (and the second conductive via 120*b*) contacts the second metal nitride structure 116 (e.g., directly contacts an upper surface of the second metal nitride structure 116).

The plurality of conductive contacts 414, the plurality of conductive wires 106, the second plurality of conductive vias 420, the first plurality of conductive vias 120, the ILD structure 412, the first IMD structure 104, the first etch stop layer 108, the second IMD structure 110, the third IMD structure 118, the second etch stop layer 418, and the fourth IMD structure 416 are part of an interconnect structure. The interconnect structure is disposed over the substrate 102 and is configured to electrically couple the devices (e.g., the resistor 101, the semiconductor device 402, etc.) that are disposed over/within the substrate 102 together in a predefined manner. While not shown in the cross-sectional view 400 of FIG. 4, it will be appreciated that the interconnect structure may comprise any number of other conductive features (e.g., conductive lines and conductive vias) and or dielectric structures (e.g., additional ILD/IMD structures).

In some embodiments, a passivation layer 422 is disposed over the fourth IMD structure 416, the resistor 101, the interconnect structure, and the substrate 102. The passivation layer 422 may be or comprise, for example, a nitride (e.g., SiN), an oxy-nitride (e.g., SiON), some other dielectric material, or a combination of the foregoing. In further embodiments, the passivation layer 422 may have a thickness of about 6000 Å, however, it will be appreciated that the passivation layer 422 have some other thickness.

Figure 5:
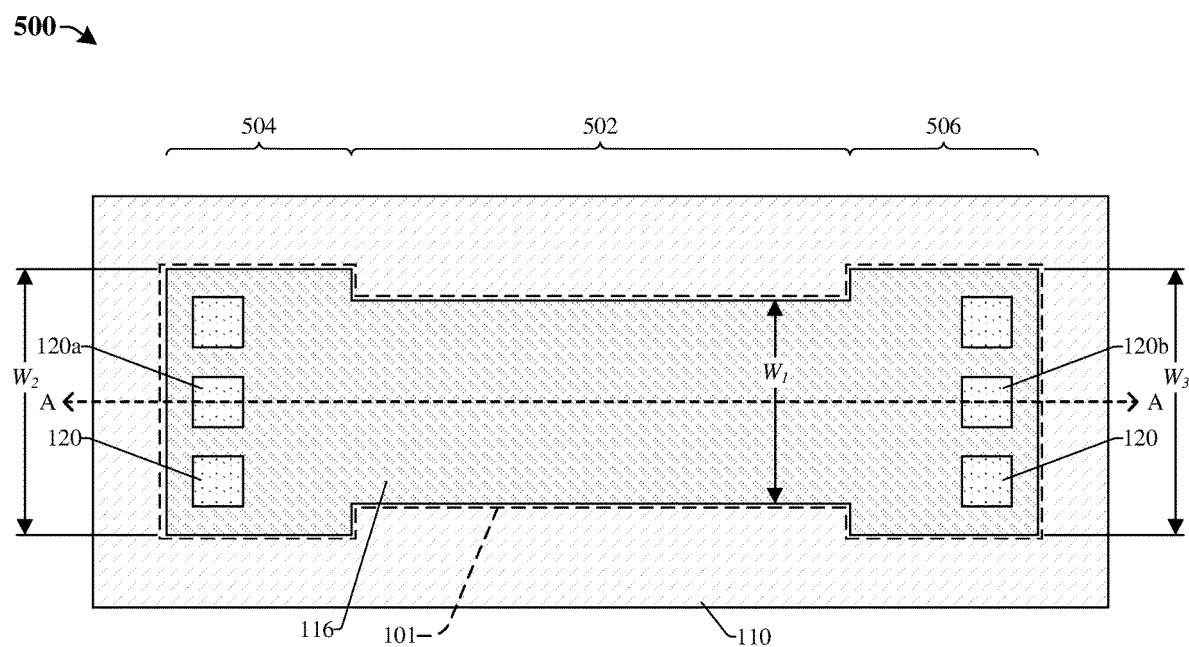
FIG. 5 illustrates a top view of some embodiments of the resistor of FIG. 4.

FIG. 5 illustrates a top view 500 of some embodiments of the resistor 101 of FIG. 4. The cross-sectional views 200-300 of FIGS. 2-3 are taken along line A-A of FIG. 5.

As shown in the top view 500 of FIG. 5, the resistor 101 (e.g., the first metal nitride structure 112, the second metal nitride structure 116, the third metal nitride structure 302, and the metal structure 114) comprises a central portion 502, a first peripheral portion 504, and a second peripheral portion 506. The central portion 502 of the resistor 101 has a first width $W_1$, the first peripheral portion 504 of the resistor 101 has a second width $W_2$, and the second peripheral portion 506 of the resistor 101 has a third width $W_3$. The first width $W_1$ is less than both the second width $W_2$ and the third width $W_3$. In some embodiments, the second width $W_2$ is substantially the same as the third width $W_3$, as shown in the top view 500 of FIG. 5. In other embodiments, the second width $W_2$ may be different than the third width $W_3$. In some embodiments, a first set of conductive vias (e.g., a set of three) of the first plurality of conductive vias 120 extend vertically from the first peripheral portion 504 of the resistor 101. In further embodiments, a second set of conductive vias (e.g., a set of three) of the first plurality of conductive vias 120 extend vertically from the second peripheral portion 506 of the resistor 101.

While not shown in the top view 500 of FIG. 5, the capping structure 417 may have a substantially same layout (e.g., a same footprint) as the resistor 101. In other words, in some embodiments, the resistor 101 (e.g., the first metal nitride structure 112, the second metal nitride structure 116, the third metal nitride structure 302, and the metal structure 114) have outer sidewalls that are substantially aligned with the outer sidewalls of the capping structure 417, respectively. In some embodiments, besides the first plurality of conductive vias 120 that extend vertically through the capping structure 417, the capping structure 417 may cover (e.g., completely cover) an upper surface of the second metal nitride structure 116.

Figure 6A:
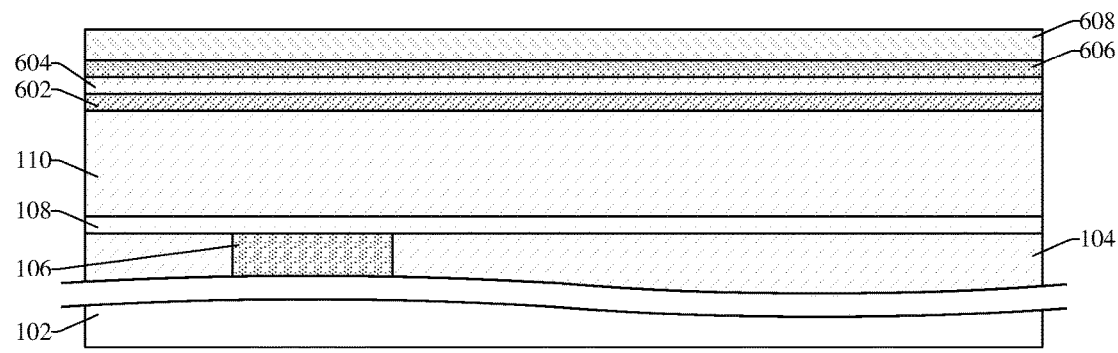
FIGS. 6A-6B through 9A-9B illustrate a series of various views of some embodiments of a method for forming an IC comprising a resistor that has a tight TCR tolerance.
Figure 6B:
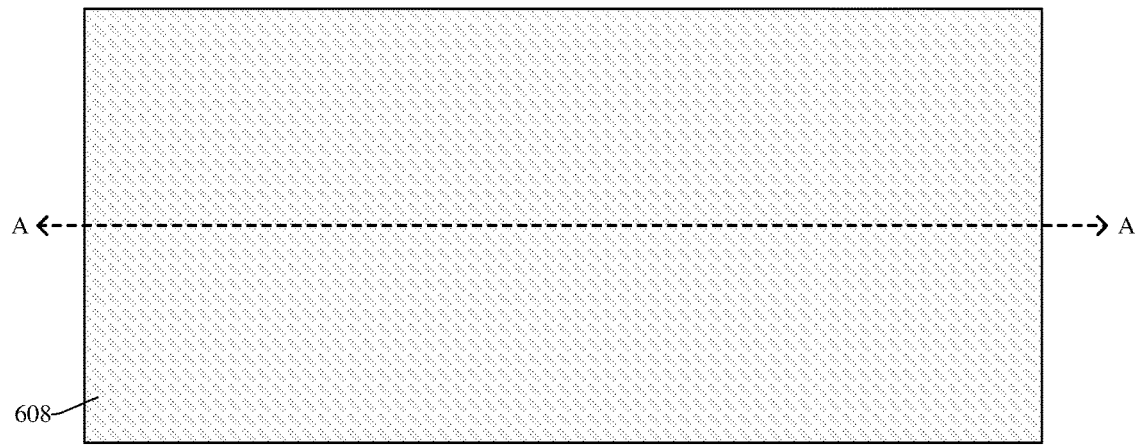

FIGS. 6A-6B through 9A-9B illustrate a series of various views of some embodiments of a method for forming an IC comprising a resistor 101 that has a tight TCR tolerance. Figures with a suffix of "A" (e.g., FIG. 6A) illustrate a series of cross-sectional views 600*a*-900*a* of some embodiments for forming the IC comprising the resistor 101 that has a tight TCR tolerance. Figures with the suffix "B" (e.g., FIG. 6B) illustrate a series of top views 600*b*-900*b* of corresponding figures of FIGS. 6A-9A (e.g., FIG. 6B illustrates a top view 600*b* of the structure of FIG. 6A). The cross-sectional views 600*a*-900*a* are taken along line A-A of their corresponding top views (e.g., the cross-sectional view 600*a* of FIG. 6A is taken along line A-A of the top view 600*b* of FIG. 6*b*). Although FIGS. 6A-6B through 9A-9B are described with reference to a method, it will be appreciated that the structures shown in FIGS. 6A-6B through 9A-9B are not limited to the method but rather may stand alone separate of the method.

As shown in cross-sectional view 600*a* of FIG. 6A and top view 600*b* of FIG. 6B, a substrate 102 is provided and a first inter-metal dielectric (IMD) structure 104 is formed over the substrate 102. The first IMD structure 104 may be formed by, for example, chemical vapor deposition (CVD), physical vapor deposition (PVD), atomic layer deposition (ALD), some other deposition process, or a combination of the foregoing. A plurality of conductive wires 106 are formed over the substrate 102 and within the first IMD structure 104. In some embodiments, the plurality of conductive wires 106 may be formed by, for example, a dual damascene process or a single damascene process. In further embodiments, the plurality of conductive wires 106 may be formed by, for example, CVD, PVD, ALD, sputtering, electrochemical plating, electroless plating, some other deposition process, or a combination of the foregoing. While not shown in the cross-sectional view 600*a* of FIG. 6A and top view 600*b* of FIG. 6B, it will be appreciated that one or more semiconductor devices 402, an interlayer dielectric (ILD) structure 412, and a plurality of conductive contacts 414 (see, e.g., FIG. 4) may be formed before the first IMD structure 104 by known complementary metal-oxide-semiconductor (CMOS) processes.

In some embodiments, a first etch stop layer 108 is then formed over the first IMD structure 104. The first etch stop layer 108 may be formed by, for example, CVD, PVD, ALD, some other deposition process, or a combination of the foregoing. A second IMD structure 110 is then formed over the first IMD structure 104 (and the first etch stop layer 108). The second IMD structure 110 may be formed by, for example, CVD, PVD, ALD, some other deposition process, or a combination of the foregoing.

Also shown in the cross-sectional view 600a of FIG. 6A and the top view 600b of FIG. 6B, a first metal nitride layer 602 is formed over the substrate 102 and the second IMD structure 110. The first metal nitride layer 602 may be or comprise, for example, tantalum nitride (TaN), titanium nitride (TiN), cobalt nitride (CoN), some other metal nitride (e.g., some other transition metal nitride), or the like. The first metal nitride layer 602 may be formed by depositing the first metal nitride layer 602 on the second IMD structure 110 by, for example, CVD, PVD, ALD, sputtering (e.g., high-power pulsed magnetron sputtering (HPPMS)), some other deposition process, or a combination of the foregoing.

In some embodiments, a second metal nitride layer 604 is formed over the first metal nitride layer 602. In other embodiments, the second metal nitride layer 604 is omitted. The second metal nitride layer 604 may be or comprise, for example, tantalum nitride (TaN), titanium nitride (TiN), cobalt nitride (CoN), some other metal nitride (e.g., some other transition metal nitride), or the like. In some embodiments, a process for forming the second metal nitride layer 604 comprises depositing the second metal nitride layer 604 on the first metal nitride layer 602. The second metal nitride layer 604 may be formed by depositing the second metal nitride layer 604 on the first metal nitride layer 602 by, for example, CVD, PVD, ALD, sputtering, some other deposition process, or a combination of the foregoing. In some embodiments, the second metal nitride layer 604 and the first metal nitride layer 602 may be formed by a same process and varying (e.g., increasing) the amount of nitrogen (N) that if pumped into a processing chamber during the deposition process.

A metal layer 606 is then formed over the second metal nitride layer 604 (and/or the first metal nitride layer 602). The metal layer 606 may be or comprise, for example, tantalum (Ta), titanium (Ti), cobalt (Co), or some other metal material (e.g., some other transition metal), or the like. In some embodiments, a process for forming the metal layer 606 comprises depositing the metal layer 606 on the second metal nitride layer 604 (or the first metal nitride layer 602). The metal layer 606 may be deposited by, for example, CVD, PVD, ALD, sputtering, electrochemical plating, electroless plating, some other deposition process, or a combination of the foregoing. In some embodiments, the second metal nitride layer 604 improves the thickness uniformity in which the metal layer 606 is deposited across the wafer. As such, the second metal nitride layer 604 may lower the cost to manufacture the resistor 101 (e.g., increase yield).

Thereafter, a third metal nitride layer 608 is formed over the metal layer 606. The third metal nitride layer 608 may be or comprise, for example, tantalum nitride (TaN), titanium nitride (TiN), cobalt nitride (CoN), some other metal nitride (e.g., some other transition metal nitride), or the like. In some embodiments, a process for forming the third metal nitride layer 608 comprises depositing the third metal nitride layer 608 on the metal layer 606. The third metal nitride layer 608 may be formed by depositing the third metal nitride layer 608 on the metal layer 606 by, for example, CVD, PVD, ALD, sputtering, some other deposition process, or a combination of the foregoing.

In some embodiments, the first metal nitride layer 602, the second metal nitride layer 604, the metal layer 606, and the third metal nitride layer 608 are formed in a same processing tool (e.g., in a same tool without breaking vacuum). In some embodiments, by forming the first metal nitride layer 602, the second metal nitride layer 604, the metal layer 606, and the third metal nitride layer 608 in the same processing tool, a cost to manufacture the resistor 101 may be reduced (e.g., increased yield due to improved thickness uniformity).

The first metal nitride layer 602 is formed with a first thickness, the second metal nitride layer 604 is formed with a second thickness, the metal layer 606 is formed with a third thickness, and the third metal nitride layer 608 is formed with a fourth thickness. The fourth thickness is greater than the first thickness. In some embodiments, the third thickness is greater than the first thickness and less than the fourth thickness. In other embodiments, the third thickness is equal to the first thickness and less than the fourth thickness. In yet other embodiments, the third thickness is less than the first thickness and less than the fourth thickness. In some embodiments, the second thickness is less than or equal to the first thickness. In other embodiments, the second thickness is greater than the first thickness.

In some embodiments, the third thickness is between about 5 percent and about 20 percent of the sum of the first thickness, the second thickness, the third thickness, and the fourth thickness. In further embodiments, the third thickness is 10.3 percent of the sum of the first thickness, the second thickness, the third thickness, and the fourth thickness. The first thickness may be between about 1 percent and about 47 percent of the sum of the first thickness, the second thickness, the third thickness, and the fourth thickness. The fourth thickness may be between about 41 percent and about 94 percent of the sum of the first thickness, the second thickness, the third thickness, and the fourth thickness.

In some embodiments, the sum of the first thickness, the second thickness, the third thickness, and the fourth thickness is less than about 3000 angstroms (Å). In further embodiments, the sum of the first thickness, the second thickness, the third thickness, and the fourth thickness is less than about 1500 Å. In yet further embodiments, the sum of the first thickness, the second thickness, the third thickness, and the fourth thickness is about 1450 Å. The first thickness may be less than about 200 Å. In some embodiments, the first thickness may be less than about 100 Å. In further embodiments, the first thickness may be about 70 Å. In some embodiments, the second thickness is between about 2 Å and about 100 Å. The third thickness may be less than about 350 Å. In some embodiments, the third thickness may be less than about 175 Å. In further embodiments, the third thickness may be about 150 Å. The fourth thickness may be less than about 2600 Å. In some embodiments, the fourth thickness may be less than about 1300 Å. In further embodiments, the fourth thickness may be about 1230 Å.

In some embodiments, the first metal nitride layer 602 and the third metal nitride layer 608 are formed with a same metal nitride material. For example, the first metal nitride layer 602 and the third metal nitride layer 608 are both formed with tantalum nitride (TaN). In further embodiments, the first metal nitride layer 602, the metal layer 606, and the third metal nitride layer 608 are formed with a same metal material. For example, the metal layer 606 is formed with titanium (Ti), and the first metal nitride layer 602 and the third metal nitride layer 608 are both formed with titanium nitride (TiN).

In some embodiments, the first metal nitride layer 602 and the second metal nitride layer 604 are formed with a same metal nitride material. For example, the first metal nitride layer 602 and the second metal nitride layer 604 are both formed with tantalum nitride (TaN). In further embodiments, the first metal nitride layer 602, the metal layer 606, the third metal nitride layer 608, and the second metal nitride layer 604 are formed with a same metal material. For example, the metal layer 606 is formed with titanium (Ti), the first metal nitride layer 602 is formed with titanium nitride (TiN), the third metal nitride layer 608 is formed with titanium nitride (TiN), and the second metal nitride layer 604 is formed with titanium nitride (TiN).

The first metal nitride layer 602 may be formed with between about 5 percent nitrogen (N) by atomic percent and about 50 percent nitrogen (N) by atomic percent. In some embodiments, the first metal nitride layer 602 is formed with about 32 percent nitrogen (N) by atomic percent. The second metal nitride layer 604 may be formed with between about 10 percent nitrogen (N) by atomic percent and about 50 percent nitrogen (N) by atomic percent. In some embodiments, the second metal nitride layer 604 is formed with about 32 percent nitrogen (N) by atomic percent. The third metal nitride layer 608 may be formed with between about 5 percent nitrogen (N) by atomic percent and about 50 percent nitrogen (N) by atomic percent. In some embodiments, the third metal nitride layer 608 is formed with about 32 percent nitrogen (N) by atomic percent. In some embodiments, the second metal nitride layer 604 may be formed with a same percent of nitrogen by atomic percentage as the first metal nitride layer 602 (and/or the third metal nitride layer 608). In other embodiments, the second metal nitride layer 604 may be formed with a different (e.g., greater) percent of nitrogen by atomic percentage as the first metal nitride layer 602 (and/or the third metal nitride layer 608).

The first metal nitride layer 602, the second metal nitride layer 604, and the third metal nitride layer 608 may be formed with specific percentages of nitrogen by atomic percent by varying the amount of nitrogen in the processing tool during their respective deposition processes. For example, by varying the amount of nitrogen that is pumped into a processing chamber during the deposition process of the first metal nitride layer 602, the first metal nitride layer 602 may be formed with between about 5 percent nitrogen (N) by atomic percent and about percent nitrogen (N) by atomic percent. As such, the resistivity of the first metal nitride layer 602, the second metal nitride layer 604, and the third metal nitride layer 608 may be tuned (e.g., because the resistivity of a given layer correlates to the ratio of nitrogen to metal (e.g., N/Ta) of the metal nitride material (e.g., TaN) of the given layer). Thus, the resistivity of the resistor 101 may be tuned, thereby lowering (or increasing) the TCR of the resistor 101.

In some embodiments, the first metal nitride layer 602 is formed as an amorphous solid, however, it will be appreciated that, in other embodiments, the first metal nitride layer 602 may be formed as crystalline solid. In some embodiments, the second metal nitride layer 604 is formed as an amorphous solid, however, it will be appreciated that, in other embodiments, the second metal nitride layer 604 may be formed as a crystalline solid. In some embodiments, the third metal nitride layer 608 is formed as a crystalline solid, however, it will be appreciated that, in other embodiments, the third metal nitride layer 608 may be formed as an amorphous solid. In further embodiments, the first metal nitride layer 602 is formed as an amorphous solid and the third metal nitride layer 608 is formed as a crystalline solid with a hexagonal crystalline phase (e.g., hexagonal crystal structure). In other embodiments, both the first metal nitride layer 602 and the third metal nitride layer 608 are formed as amorphous solids or crystalline solids.

The metal layer 606 is formed as a crystalline solid. In some embodiments, the metal layer 606 is formed with a crystalline phase (e.g., crystal structure) that is at least 50 percent alpha-phase (e.g., α-phase TaN). In some embodiments, the metal material (e.g., Ta) of the second metal nitride layer 604 may have a different crystalline phase than the metal layer 606 (e.g., the tantalum of the second metal nitride layer 604 may be substantially beta-phase tantalum nitride (β-phase TaN)).

Figure 7A:
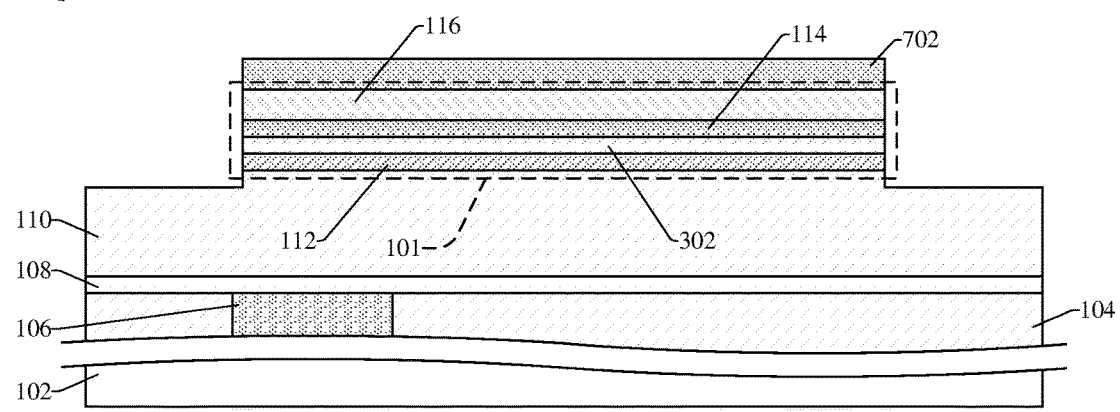
Figure 7B:
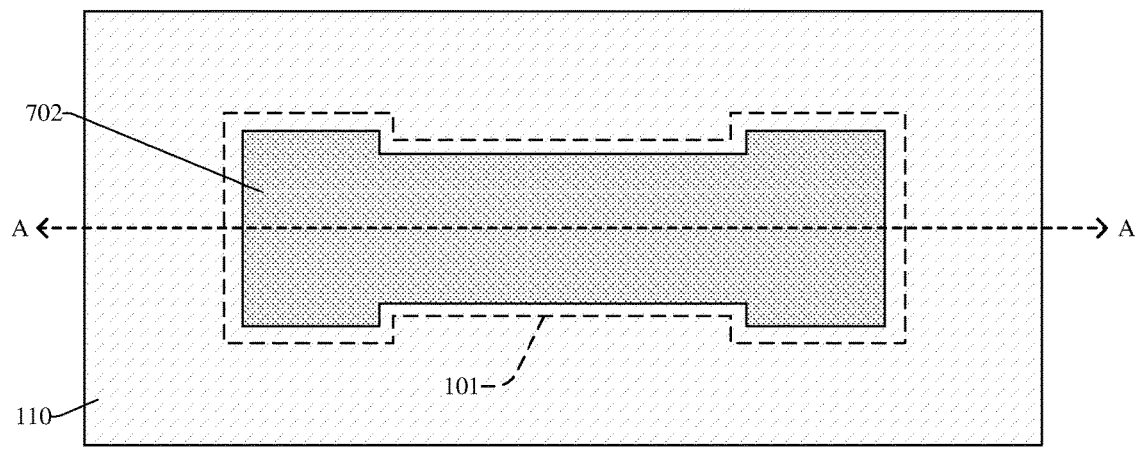

As shown in cross-sectional view 700a of FIG. 7A and top view 700b of FIG. 7B, a first patterning process is performed on the first metal nitride layer 602, the second metal nitride layer 604, the metal layer 606, and the third metal nitride layer 608 (see, FIGS. 6A-6B) to form a first metal nitride structure 112, a third metal nitride structure 302, a metal structure 114, and a second metal nitride structure 116, respectively. In some embodiments, the first patterning process comprises forming a patterned masking layer 702 (e.g., positive/negative photoresist, a hardmask, etc.) over the third metal nitride layer 608. The patterned masking layer 702 may be formed by forming a masking layer (not shown) on the third metal nitride layer 608 (e.g., via a spin-on process), exposing the masking layer to a pattern (e.g., via a lithography process, such as photolithography, extreme ultraviolet lithography, or the like), and developing the masking layer, thereby forming the patterned masking layer 702 over the third metal nitride layer 608.

Thereafter, with the patterned masking layer 702 in place over the third metal nitride layer 608, an etching process (e.g., an anisotropic etching process) is performed on the third metal nitride layer 608, the metal layer 606, the second metal nitride layer 604, and the first metal nitride layer 602 to selectively etch the third metal nitride layer 608, the metal layer 606, the second metal nitride layer 604, and the first metal nitride layer 602 according to the patterned masking layer 702. The etching process removes unmasked portions of the third metal nitride layer 608, the metal layer 606, the second metal nitride layer 604, and the first metal nitride layer 602, thereby forming the second metal nitride structure 116, the metal structure 114, the third metal nitride structure 302, and the first metal nitride structure 112, respectively. In some embodiments, the etching process may be, for example, a dry etching process, a reactive ion etching (RIE) process, a wet etching process, some other etching process, or a combination of the foregoing. In further embodiments, the patterned masking layer 702 is subsequently stripped away (See, FIGS. 8A-8B). In yet further embodiments, the first patterning process may also partially remove unmasked portions of the second IMD structure 110, as shown in the cross-sectional view 700a of FIG. 7A and the top view 700b of FIG. 7B. In some embodiments, formation of the resistor 101 is complete after the first patterning process is complete.

Figure 8A:
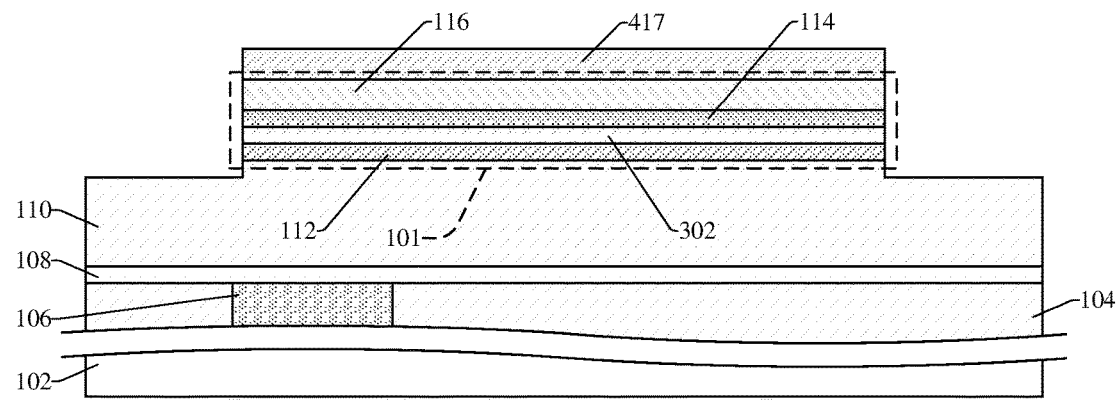
Figure 8B:
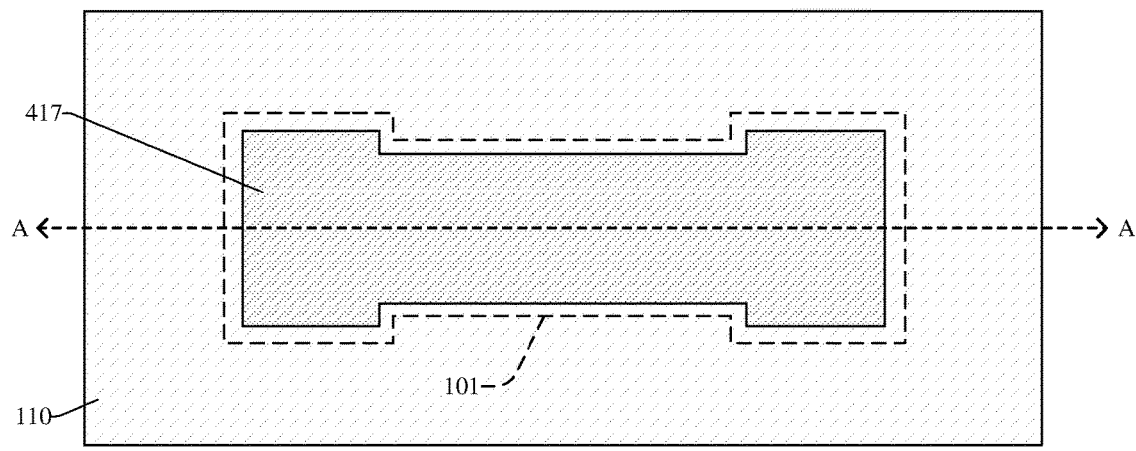

As shown in cross-sectional view 800a of FIG. 8A and top view 800b of FIG. 8B, a capping structure 417 is formed over the resistor 101. The capping structure 417 is formed covering an upper an upper surface of the resistor 101. In some embodiments, the capping structure 417 is formed on the second metal nitride structure 116.

In some embodiments, a process for forming the capping structure 417 comprises forming a capping layer (not shown) on the resistor 101 and the second IMD structure 110. In some embodiments, the capping layer is formed covering (e.g., completely covering) the resistor 101 (and the second IMD structure 110). In some embodiments, the capping layer is formed via a deposition process. The deposition process may be, for example, CVD, PVD, ALD, some other deposition process, or a combination of the foregoing. In further embodiments, the capping layer is formed as a conformal layer.

The capping layer may be or comprise, for example, a nitride (e.g., SiN), an oxy-nitride (e.g., SiON), some other dielectric material, or a combination of the foregoing. In some embodiments, the capping layer is formed with a thickness between about 500 Å and about 1000 Å. In further embodiments, the capping layer is formed with a thickness of about 750 Å, however, it will be appreciated that the capping layer may be formed with some other thickness. In yet further embodiments, the capping layer is a nitride that has a different chemical composition than the second metal nitride structure 116 (e.g., the capping layer is SiN and the second metal nitride structure 116 is TaN).

After the capping layer is formed, a second patterning process is performed on the capping layer to form the capping structure 417. In some embodiments, the second patterning process comprises forming a patterned masking layer (not shown) (e.g., positive/negative photoresist, a hardmask, etc.) over the capping layer. Thereafter, with the patterned masking layer in place, an etching process (e.g., an anisotropic etching process) is performed on the capping layer according to the patterned masking layer. The etching process removes unmasked portions of the capping layer, thereby forming the capping structure 417. In some embodiments, the etching process may be, for example, a dry etching process, a RIE process, a wet etching process, some other etching process, or a combination of the foregoing. In further embodiments, the patterned masking layer is subsequently stripped away. While the cross-sectional view 800a of FIG. 8A and top view 800b of FIG. 8B illustrate the capping layer being formed after the first patterning process (see, e.g., FIGS. 7A-7B), it will be appreciated that the capping layer may be formed on and covering the third metal nitride layer 608. In such embodiments, the capping layer is patterned to form the capping structure 417 before (or at the same time) the third metal nitride layer 608 is patterned to form the second metal nitride structure 116.

Figure 9A:
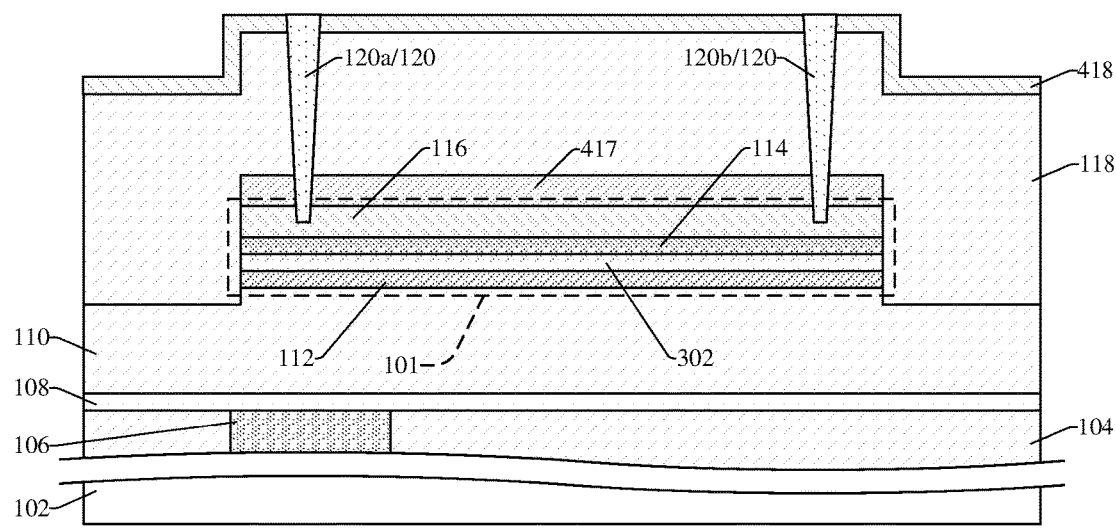
Figure 9B:
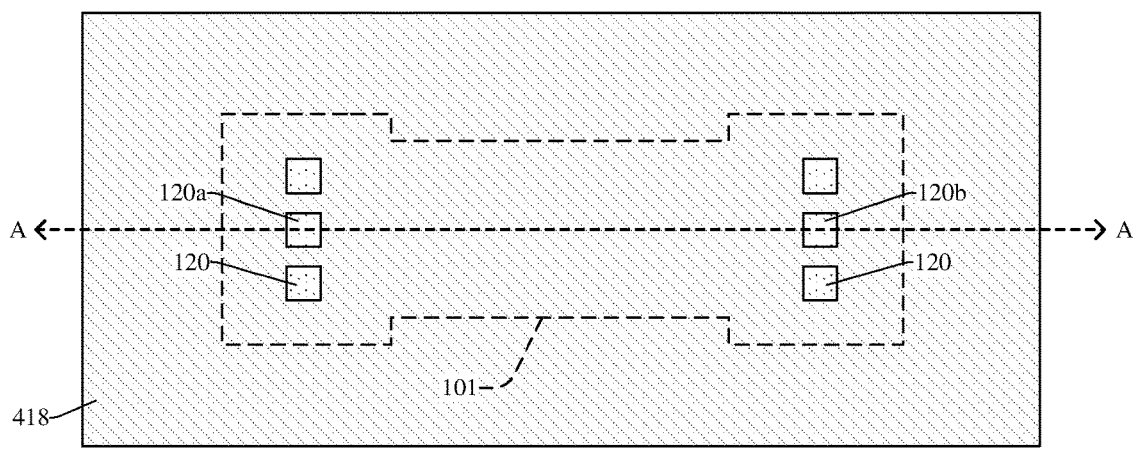

As shown in cross-sectional view 900a of FIG. 9A and top view 900b of FIG. 9B, a third IMD structure 118 is formed over the resistor 101, the second IMD structure 110, and the capping structure 417. Also shown in the cross-sectional view 900a of FIG. 9A and the top view 900b of FIG. 9B, in some embodiments, a second etch stop layer 418 is formed over the third IMD structure 118. Also shown in the cross-sectional view 900a of FIG. 9A and the top view 900b of FIG. 9B, a first plurality of conductive vias 120 are formed over the resistor and in the third IMD structure 118. The first plurality of conductive vias 120 extend (e.g., extend vertically) through the second etch stop layer 418, the third IMD structure 118, and the capping structure 417. In some embodiments, the first plurality of conductive vias 120 also extend partially through the second metal nitride structure 116, such that lower surfaces of the first plurality of conductive vias 120 contact the second metal nitride structure 116.

The first plurality of conductive vias 120 are electrically coupled to the second metal nitride structure 116 (and thus the resistor 101). For example, a first conductive via 120a is electrically coupled to the second metal nitride structure 116 at a first location, and a second conductive via 120b is electrically coupled to the second metal nitride structure 116 at a second location that is spaced (e.g., laterally spaced) from the first location.

In some embodiments, a process for forming the third IMD structure 118, the second etch stop layer 418, and the first plurality of conductive vias 120 comprises forming the third IMD structure 118 over the resistor 101, the second IMD structure 110, and the capping structure 417. The third IMD structure may be formed by, for example, CVD, PVD, ALD, some other deposition process, or a combination of the foregoing. In some embodiments, the second etch stop layer 418 is then formed over the third IMD structure 118. The second etch stop layer 418 may be formed by, for example, CVD, PVD, ALD, some other deposition process, or a combination of the foregoing.

Thereafter, via openings are formed in the second etch stop layer 418, the third IMD structure 118, and the capping structure 417. The via openings extend through (e.g., extend vertically through) the second etch stop layer 418, the third IMD structure 118, and the capping structure 417 to the second metal nitride structure 116. For example, a first via opening is formed extending vertically through the second etch stop layer 418, the third IMD structure 118, and the capping structure 417 to expose the second metal nitride structure 116 at the first location, and a second via opening is formed extending vertically through the second etch stop layer 418, the third IMD structure 118, and the capping structure 417 to expose the second metal nitride structure 116 at the second location. A conductive material (e.g., copper (Cu)) is formed on the second etch stop layer 418 and in the via openings. The conductive material may be formed using a deposition process (e.g., CVD, PVD, sputtering, etc.) and/or a plating process (e.g., electrochemical plating, electroless plating, etc.). Thereafter, a planarization process (e.g., CMP) is performed on the conductive material to form the first plurality of conductive vias 120 in the third IMD structure 118. Although not shown, it will be appreciated that any number of other conductive features (e.g., conductive lines and conductive vias) and/or IMD structures may be formed over the third IMD structure 118 and the first plurality of conductive vias 120 (see, e.g., FIG. 4).

Figure 10:
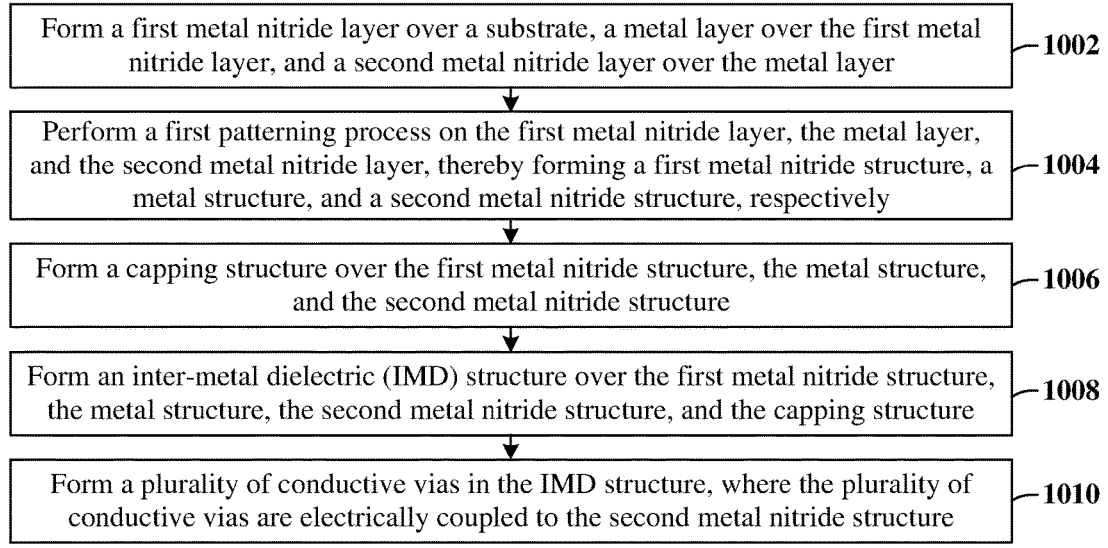
FIG. 10 illustrates a flowchart of some embodiments of a method for forming an IC comprising a resistor that has a tight TCR tolerance.

FIG. 10 illustrates a flowchart 1000 of some embodiments of a method for forming an IC comprising a resistor 101 that has a tight TCR tolerance. While the flowchart 1000 of FIG. 10 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1002, a first metal nitride layer is formed over a substrate, a metal layer is formed over the first metal nitride layer, and a second metal nitride layer is formed over the metal layer. FIGS. 6A-6B illustrate various views of some embodiments corresponding to act 1002.

At act 1004, a first patterning process is performed on the first metal nitride layer, the metal layer, and the second metal nitride layer, thereby forming a first metal nitride structure, a metal structure, and a second metal nitride structure, respectively. FIGS. 7A-7B illustrate various views of some embodiments corresponding to act 1004.

At act 1006, a capping structure is formed over the first metal nitride structure, the metal structure, and the second metal nitride structure. FIGS. 8A-8B illustrate various views of some embodiments corresponding to act 1006.

At act 1008, an inter-metal dielectric (IMD) structure is formed over the first metal nitride structure, the metal structure, the second metal nitride structure, and the capping structure. FIGS. 9A-9B illustrate various views of some embodiments corresponding to act 1008.

At act 1010, a plurality of conductive vias are formed in the IMD structure, where the plurality of conductive vias are electrically coupled to the second metal nitride structure. FIGS. 9A-9B illustrate various views of some embodiments corresponding to act 1010.

In some embodiments, the present application provides an integrated chip (IC). The IC comprises a substrate. A resistor overlies the substrate. The resistor comprises a first metal nitride structure, a second metal nitride structure spaced from the first metal nitride structure, and a metal structure disposed between the first metal nitride structure and the second metal nitride structure. A first dielectric structure is disposed over the substrate and the resistor.

In some embodiments, the present application provides an integrated chip (IC). The IC comprises a semiconductor substrate. A first dielectric structure is disposed over the semiconductor substrate. A thin film resistor (TFR) is disposed over the first dielectric structure. The TFR comprises a first metal nitride structure disposed over the first dielectric structure; a second metal nitride structure overlying the first metal nitride structure, where both the first metal nitride structure and the second metal nitride structure comprise a metal nitride material; and a metal structure disposed vertically between the first metal nitride structure and the second metal nitride structure. A second dielectric structure is disposed over the semiconductor substrate and the TFR. A pair of conductive structures extend through the second dielectric structure and are electrically coupled to the TFR.

In some embodiments, the present application provides a method for forming an integrated chip (IC). The method comprises forming a resistor over a substrate, where forming the resistor comprises depositing a first metal nitride layer over the substrate; depositing a metal layer on the first metal nitride layer; depositing a second metal nitride layer on the metal layer; and patterning the first metal nitride layer, the metal layer, and the second metal nitride layer, thereby forming a first metal nitride structure, a metal structure, and a second metal nitride structure, respectively. A dielectric layer is formed over the resistor and the substrate. A pair of conductive structures are formed extending vertically through the dielectric layer to the resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a semiconductor substrate;
a first dielectric structure disposed over the semiconductor substrate;
a resistor disposed between the semiconductor substrate and first dielectric structure, the resistor comprising a continuous body of conductive material extending laterally over the semiconductor substrate, wherein continuous body comprises:
a first metal nitride structure;
a second metal nitride structure spaced apart vertically from the first metal nitride structure; and
a metal structure disposed between the first metal nitride structure and the second metal nitride structure;
a second dielectric structure disposed over the semiconductor substrate and the resistor; and
a pair of conductive structures extending through the second dielectric structure and electrically coupled to the second metal nitride structure.

2. An integrated chip (IC), comprising:
a semiconductor substrate;
a first dielectric structure disposed over the semiconductor substrate;
a resistor disposed between the semiconductor substrate and first dielectric structure, the resistor comprising a continuous body of conductive material extending laterally over the semiconductor substrate, wherein continuous body comprises:
a first metal nitride structure;
a second metal nitride structure spaced apart vertically from the first metal nitride structure; and
a metal structure disposed between the first metal nitride structure and the second metal nitride structure;
a second dielectric structure disposed over the semiconductor substrate and the resistor; and
a pair of conductive structures extending through the second dielectric structure and electrically coupled to the second metal nitride structure, wherein:
the first metal nitride structure comprises a metal;
the metal structure comprises the metal; and
the second metal nitride structure comprises the metal.

3. The IC of claim 2, wherein the metal is tantalum, titanium, or cobalt.

4. The IC of claim 1, wherein:
the first metal nitride structure is tantalum nitride (TaN);
the metal structure is tantalum (Ta); and
the second metal nitride structure is TaN.

5. The IC of claim 4, wherein:
the TaN of the first metal nitride structure comprises between about 5 percent nitrogen by atomic percent and about 50 percent nitrogen by atomic percent; and
the TaN of the second metal nitride structure comprises between about 5 percent nitrogen by atomic percent and about 50 percent nitrogen by atomic percent.

6. The IC of claim 4, wherein:
the TaN of the first metal nitride structure is $Ta_2N$; and
the TaN of the second metal nitride structure is $Ta_2N$.

7. The IC of claim 3, wherein a crystal structure of the metal structure is at least 50 percent body-centered cubic.

8. An integrated chip (IC), comprising:
a semiconductor substrate;
a first dielectric structure disposed over the semiconductor substrate;

a resistor disposed between the semiconductor substrate and first dielectric structure, the resistor comprising a continuous body of conductive material extending laterally over the semiconductor substrate, wherein continuous body comprises:
  a first metal nitride structure;
  a second metal nitride structure spaced apart vertically from the first metal nitride structure; and
  a metal structure disposed between the first metal nitride structure and the second metal nitride structure;
a second dielectric structure disposed over the semiconductor substrate and the resistor; and
a pair of conductive structures extending through the second dielectric structure and electrically coupled to the second metal nitride structure,
the first metal nitride structure has a first thickness; and
the second metal nitride structure has a second thickness that is greater than the first thickness.

9. The IC of claim 1, wherein:
the resistor has a first thickness;
the metal structure has a second thickness; and
the second thickness is between about 5 percent and about 20 percent of the first thickness.

10. The IC of claim 1, wherein:
the metal structure overlies the first metal nitride structure; and
the second metal nitride structure overlies the metal structure.

11. The IC of claim 10, wherein:
outer sidewalls of the metal structure are substantially aligned with outer sidewalls of the first metal nitride structure, respectively; and
outer sidewalls of the second metal nitride structure are substantially aligned with the outer sidewalls of the metal structure, respectively.

12. The IC of claim 1, wherein the first metal nitride structure, the metal structure, and the second metal nitride structure each comprise tantalum, titanium, or cobalt.

13. The IC of claim 1, further comprising:
a capping structure disposed vertically between the second metal nitride structure and the second dielectric structure, wherein the capping structure is a nitride that has a different chemical composition than a first metal nitride material of the first metal nitride structure and a second metal nitride material of the second metal nitride structure.

14. The IC of claim 2, wherein:
the first metal nitride structure comprises between about 5 percent nitrogen by atomic percent and about 50 percent nitrogen by atomic percent; and
the second metal nitride structure comprises between about 5 percent nitrogen by atomic percent and about 50 percent nitrogen by atomic percent.

15. The IC of claim 2, further comprising:
a capping structure disposed vertically between the second metal nitride structure and the second dielectric structure, wherein the capping structure is a nitride that has a different chemical composition than a first metal nitride material of the first metal nitride structure and a second metal nitride material of the second metal nitride structure.

16. The IC of claim 8, wherein:
the first metal nitride structure comprises tantalum nitride (TaN);
the metal structure comprises tantalum (Ta); and
the second metal nitride structure comprises TaN.

17. The IC of claim 8, wherein:
the first metal nitride structure comprises between about 5 percent nitrogen by atomic percent and about 50 percent nitrogen by atomic percent; and
the second metal nitride structure comprises between about 5 percent nitrogen by atomic percent and about 50 percent nitrogen by atomic percent.

18. The IC of claim 8, wherein:
the first metal nitride structure comprises a metal;
the metal structure comprises the metal; and
the second metal nitride structure comprises the metal.

19. The IC of claim 18, wherein the metal is tantalum, titanium, or cobalt.

20. The IC of claim 8, further comprising:
a capping structure disposed vertically between the second metal nitride structure and the second dielectric structure, wherein the capping structure is a nitride that has a different chemical composition than a first metal nitride material of the first metal nitride structure and a second metal nitride material of the second metal nitride structure;
wherein a crystal structure of the metal structure is at least 50 percent body-centered cubic; and
wherein a material of the first metal nitride structure, the second metal nitride structure, and the metal structure comprises a transition metal.

\* \* \* \* \*